US011148439B2

(12) United States Patent
Asada et al.

(10) Patent No.: US 11,148,439 B2
(45) **Date of Patent: *Oct. 19, 2021**

(54) IMAGE RECORDING DEVICE

(71) Applicant: Brother Kogyo Kabushiki Kaisha, Nagoya (JP)

(72) Inventors: Tetsuo Asada, Kuwana (JP); Kensuke Hirate, Kasugai (JP); Yoshiyuki Washino, Gifu-ken (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/809,826

(22) Filed: Mar. 5, 2020

(65) Prior Publication Data

US 2020/0331277 A1 Oct. 22, 2020

Related U.S. Application Data

(63) Continuation of application No. 16/167,992, filed on Oct. 23, 2018, now Pat. No. 10,583,671, which is a (Continued)

(30) Foreign Application Priority Data

Jun. 17, 2010 (JP) ................................ 2010-137854

(51) Int. Cl.
*B41J 11/00* (2006.01)
*B41J 11/48* (2006.01)
(Continued)

(52) U.S. Cl.
CPC .......... *B41J 11/0045* (2013.01); *B41J 11/007* (2013.01); *B41J 11/485* (2013.01); (Continued)

(58) Field of Classification Search
CPC .... B41J 11/485; B41J 11/0045; B41J 13/103; H04N 1/00543; B65H 1/266; B65H 85/00
See application file for complete search history.

(56) References Cited

U.S. PATENT DOCUMENTS 5,052,670 A 10/1991 Makiura et al.
5,240,238 A 8/1993 Lee
(Continued)

FOREIGN PATENT DOCUMENTS

JP S63-252835 A 10/1988
JP H04-20443 A 1/1992
(Continued)

OTHER PUBLICATIONS

Japan Patent Office, Decision of Refusal issued in Japanese Patent Application No. 2018-228808, dated Sep. 1, 2020.
(Continued)

*Primary Examiner* — John Zimmermann
(74) *Attorney, Agent, or Firm* — Baker Botts L.L.P.

(57) ABSTRACT

A first feeder contacts a first surface of a first sheet held in a first tray and feeds the first sheet toward a recording unit. A second feeder contacts a first surface of a second sheet held in a second tray and feeds the second sheet toward the recording unit. An inner member is disposed above a standing plate. An outer member comprises an upstream portion opposing the standing plate, and a downstream portion opposing the inner member. The inner member guides the first surface of the first sheet and the first surface of the second sheet. The standing plate guides the first surface of the second sheet. The upstream portion of the outer member guides a second surface of the second sheet, and the downstream portion guides a second surface of the first sheet and the second surface of the second sheet. The standing plate moves relative to the outer member.

20 Claims, 8 Drawing Sheets

Related U.S. Application Data continuation of application No. 15/867,815, filed on Jan. 11, 2018, now Pat. No. 10,112,416, which is a continuation of application No. 15/435,447, filed on Feb. 17, 2017, now Pat. No. 9,884,492, which is a continuation of application No. 14/997,188, filed on Jan. 15, 2016, now Pat. No. 9,604,473, which is a continuation of application No. 14/792,287, filed on Jul. 6, 2015, now Pat. No. 9,254,691, which is a continuation of application No. 14/586,807, filed on Dec. 30, 2014, now Pat. No. 9,096,400, which is a continuation of application No. 14/015,651, filed on Aug. 30, 2013, now Pat. No. 8,937,755, which is a continuation of application No. 13/072,755, filed on Mar. 27, 2011, now Pat. No. 8,526,081.

(51) Int. Cl.

| | |
|---|---|
| ***B41J 13/10*** | (2006.01) |
| ***B41J 29/02*** | (2006.01) |
| ***B65H 85/00*** | (2006.01) |
| ***B65H 1/26*** | (2006.01) |
| ***B65H 3/06*** | (2006.01) |
| ***B65H 5/26*** | (2006.01) |
| ***B65H 5/38*** | (2006.01) |
| ***B65H 5/00*** | (2006.01) |
| ***B65H 1/04*** | (2006.01) |
| ***B65H 1/28*** | (2006.01) |
| ***B41J 11/58*** | (2006.01) |

(52) U.S. Cl.

CPC ............. *B41J 11/58* (2013.01); *B41J 13/103* (2013.01); *B41J 29/023* (2013.01); *B65H 1/04* (2013.01); *B65H 1/266* (2013.01); *B65H 1/28* (2013.01); *B65H 3/0684* (2013.01); *B65H 5/00* (2013.01); *B65H 5/26* (2013.01); *B65H 5/38* (2013.01); *B65H 85/00* (2013.01); *H05K 999/99* (2013.01); *B65H 2402/441* (2013.01); *B65H 2402/46* (2013.01); *B65H 2404/513* (2013.01); *B65H 2404/612* (2013.01); *B65H 2404/62* (2013.01); *B65H 2405/1136* (2013.01); *B65H 2405/3322* (2013.01)

(56) References Cited

U.S. PATENT DOCUMENTS

| | | | | |
|---|---|---|---|---|
| 5,552,902 | A * | 9/1996 | Kohno | H04N 1/0057 347/3 |
| 5,785,308 | A | 7/1998 | Flores et al. | |
| 5,995,800 | A | 11/1999 | Ahn | |
| 6,073,927 | A | 6/2000 | Sako et al. | |
| 6,148,172 | A | 11/2000 | Kanda et al. | |
| 6,247,784 | B1 * | 6/2001 | Obana | B41J 2/17543 347/37 |
| 7,543,808 | B2 | 6/2009 | Silverbrook | |
| 8,089,666 | B2 | 1/2012 | Andoh et al. | |
| 8,154,770 | B2 | 4/2012 | Shiraki et al. | |
| 8,493,639 | B2 | 7/2013 | Samoto et al. | |
| 8,508,819 | B2 | 8/2013 | Asada et al. | |
| 8,768,235 | B2 | 7/2014 | Asada et al. | |
| 8,807,739 | B2 | 8/2014 | Okamoto | |
| 2004/0086310 | A1 | 5/2004 | Eskey | |
| 2006/0261535 | A1 | 11/2006 | Shiohara et al. | |
| 2007/0145678 | A1 | 6/2007 | Terada | |
| 2010/0078872 | A1 | 4/2010 | Asada et al. | |
| 2010/0143013 | A1 | 6/2010 | Azeta | |
| 2010/0194027 | A1 * | 8/2010 | Takagi | B65H 5/38 271/3.19 |
| 2010/0315460 | A1 | 12/2010 | Matsuhashi | |
| 2011/0311294 | A1 | 12/2011 | Kawamata et al. | |
| 2015/0273899 | A1 * | 10/2015 | Samoto | B41J 11/0095 347/16 |

FOREIGN PATENT DOCUMENTS

| | | | |
|---|---|---|---|
| JP | H07-257768 | A | 10/1995 |
| JP | H08-108952 | A | 4/1996 |
| JP | H09-235030 | A | 9/1997 |
| JP | 2002-362766 | A | 12/2002 |
| JP | 2007-240843 | A | 9/2007 |
| JP | 2007-279535 | A | 10/2007 |
| JP | 2009-179447 | A | 8/2009 |
| JP | 2010-083626 | A | 4/2010 |
| JP | 2017-149586 | A | 8/2017 |

OTHER PUBLICATIONS

Japan Patent Office, Notice of Reasons for Rejection for Japanese Patent Application No. 2010-137854 (related to U.S. Pat. No. 9,096,400), dated Jan. 21, 2014.

Japan Patent Office, Notice of Reasons for Rejection for Japanese Patent Application No. 2014-100202 (related to U.S. Pat. No. 9,096,400), dated Mar. 17, 2015.

Japan Patent Office, Notice of Reasons for Rejection for Japanese Patent Application No. 2017-113229, dated Apr. 10, 2018 (partial English translation).

Japan Patent Office, Notice of Reasons for Refusal issued in Japanese Patent Application No. 2018-228808, dated Oct. 25, 2019.

* cited by examiner

IMAGE RECORDING DEVICE

CROSS-REFERENCE TO RELATED APPLICATIONS

The present application is a continuation of U.S. patent application Ser. No. 16/167,992, which was filed on Oct. 23, 2018, which is a continuation of U.S. patent application Ser. No. 15/867,815, which was filed on Jan. 11, 2018, which is a continuation of U.S. patent application Ser. No. 15/435,447, which was filed on Feb. 17, 2017, now U.S. Pat. No. 9,884,492 B2, which issued on Feb. 6, 2018, which is a continuation of U.S. patent application Ser. No. 14/997,188, which was filed on Jan. 15, 2016, now U.S. Pat. No. 9,604,473 B2, which issued on Mar. 28, 2017, which is a continuation of U.S. patent application Ser. No. 14/792,287, which was filed on Jul. 6, 2015, now U.S. Pat. No. 9,254,691 B2, which issued on Feb. 9, 2016, which is a continuation of U.S. patent application Ser. No. 14/586,807, which was filed on Dec. 30, 2014, now U.S. Pat. No. 9,096,400 B2, which was issued on Aug. 4, 2015, which is a continuation of U.S. patent application Ser. No. 14/015,651, which was filed on Aug. 30, 2013, now U.S. Pat. No. 8,937,755 B2, which was issued on Jan. 20, 2015, which is a continuation of U.S. patent application Ser. No. 13/072,755, which was filed on Mar. 27, 2011, now U.S. Pat. No. 8,526,081 B2, which was issued on Sep. 3, 2013, which claims priority from Japanese Patent Application Publication No. 2010-137854, which was filed on Jun. 17, 2010, the disclosures of which are incorporated herein by reference in their entirety.

BACKGROUND OF THE INVENTION

1. Field of the Invention

The present invention relates to an image recording device configured to record an image on a recording sheet, and particularly to an image recording device comprising a plurality of trays arranged vertically one above another.

2. Description of Related Art

A known image recording device comprises a first guide member attached to a main body of the image recording device, a second guide member positioned outside the first guide member, and a third guide member positioned outside the second guide member. The first guide member and the second guide member define a U-shaped first path through which a sheet is guided from an upper tray to a recording unit. The second guide member and the third guide member define a U-shaped second path through which a sheet is guided from a lower tray to the recording unit.

The first guide member, second guide member, and third guide member are arranged horizontally side by side, and the second guide member positioned between the first guide member and the third guide member separates the first guide path from the second guide path. Thus, the size of the image recording device may increase horizontally.

SUMMARY OF THE INVENTION

Therefore, an object of the invention is to provide an image recording device comprising a plurality of trays arranged vertically one above another while preventing an increase in size of the image recording device horizontally. A technical advantage of the invention is that a sheet is selectively fed from the plurality of the trays to a recording unit while being guided by a relatively small number of members.

According to an embodiment of the invention, an image recording device comprises a first tray, a second tray, a recording unit, a first feeder, a second feeder, an inner member, and an outer member. The first tray comprises a first bottom plate configured to hold thereon a first sheet, and a standing plate extending upward from a downstream end portion, in a feed direction, of the first bottom plate. The second tray is disposed below the first tray and comprises a second bottom plate configured to hold thereon a second sheet. The recording unit is configured to record an image selectively on the first sheet and the second sheet. The first feeder is configured to contact a first surface of the first sheet held on the first bottom plate and to feed the first sheet toward the recording unit in the feed direction. The second feeder is configured to contact a first surface of the second sheet held on the second bottom plate and to feed the second sheet toward the recording unit in the feed direction. The inner member is disposed above the standing plate of the first tray. The outer member comprises an upstream portion opposing the inclined plate, and a downstream portion disposed downstream, in the feed direction, of the upstream portion and opposing the inner member. The inner member is configured to guide the first surface of the first sheet fed by the first feeder and the first surface of the second sheet fed by the second feeder. The standing plate is configured to guide the first surface of the second sheet fed by the second feeder. The upstream portion of the outer member is configured to guide a second surface of the second sheet fed by the second feeder, and the downstream portion of the outer member is configured to guide a second surface of the first sheet fed by the first feeder and the second surface of the second sheet fed by the second feeder. The standing plate of the first tray is configured to move relative to the outer member.

Other objects, features, and advantages will be apparent to persons of ordinary skill in the art from the following detailed description of the invention and the accompanying drawings.

BRIEF DESCRIPTION OF THE DRAWINGS

For a more complete understanding of the invention, the needs satisfied thereby, and the features and technical advantages thereof, reference now is made to the following descriptions taken in connection with the accompanying drawings.

DETAILED DESCRIPTION OF EMBODIMENTS

Figure 1:
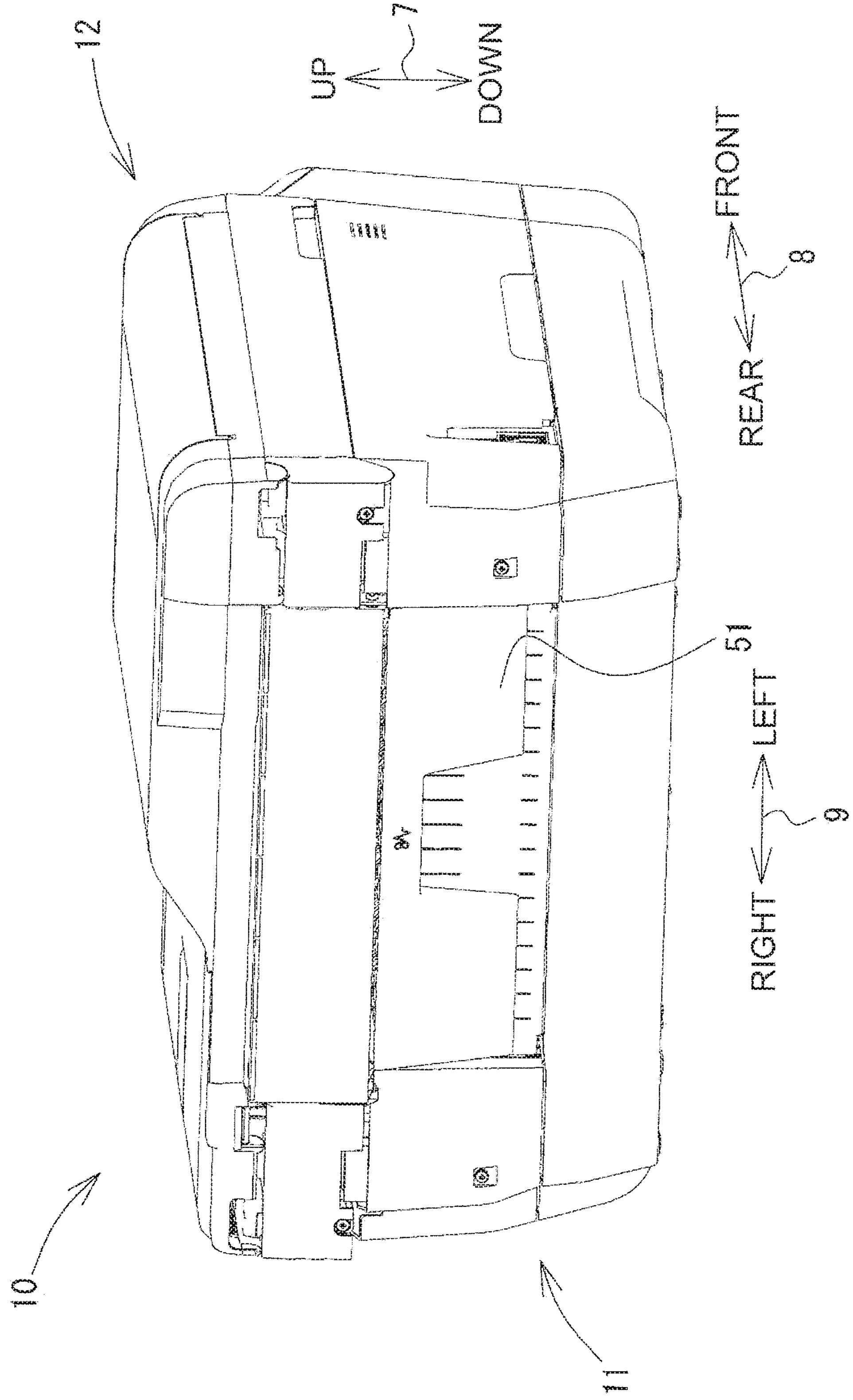
FIG. 1 is a perspective view of a multi-function device according to an embodiment of the invention.

Embodiments of the invention and their features and technical advantages may be understood by referring to FIGS. 1-8, like numerals being used for like corresponding parts in the various drawings.

In the following description, an up-down direction 7 is defined in relation to a multi-function device 10 disposed in an orientation in which it is intended to be used (i.e., disposed in a state shown in FIG. 1). A front-rear direction 8 is defined such that a side on which an outer member 51 (see FIG. 1) is disposed is regarded as a rear side. A left-right direction 9 is defined in relation to a front side of the multi-function device 10.

As shown in FIG. 1, the multi-function device 10 has a substantially box shape. A scanner 12 is disposed in an upper portion, and an image recording device, e.g., an ink-jet printer 11, is disposed in a lower portion of the multi-function device 10. The multi-function device 10 has various functions, such as a facsimile function and a print function. Functions other than the print function may be optional.

An opening (not shown) is formed on the front side of the printer 11. A first tray 22 (see FIG. 3) and a second tray 21 (see FIG. 3) can be inserted in and removed from the printer 11 through the opening. The trays 21 and 22 are slid in the front-rear direction 8 to be inserted in and removed from the printer 11.

Figure 3:
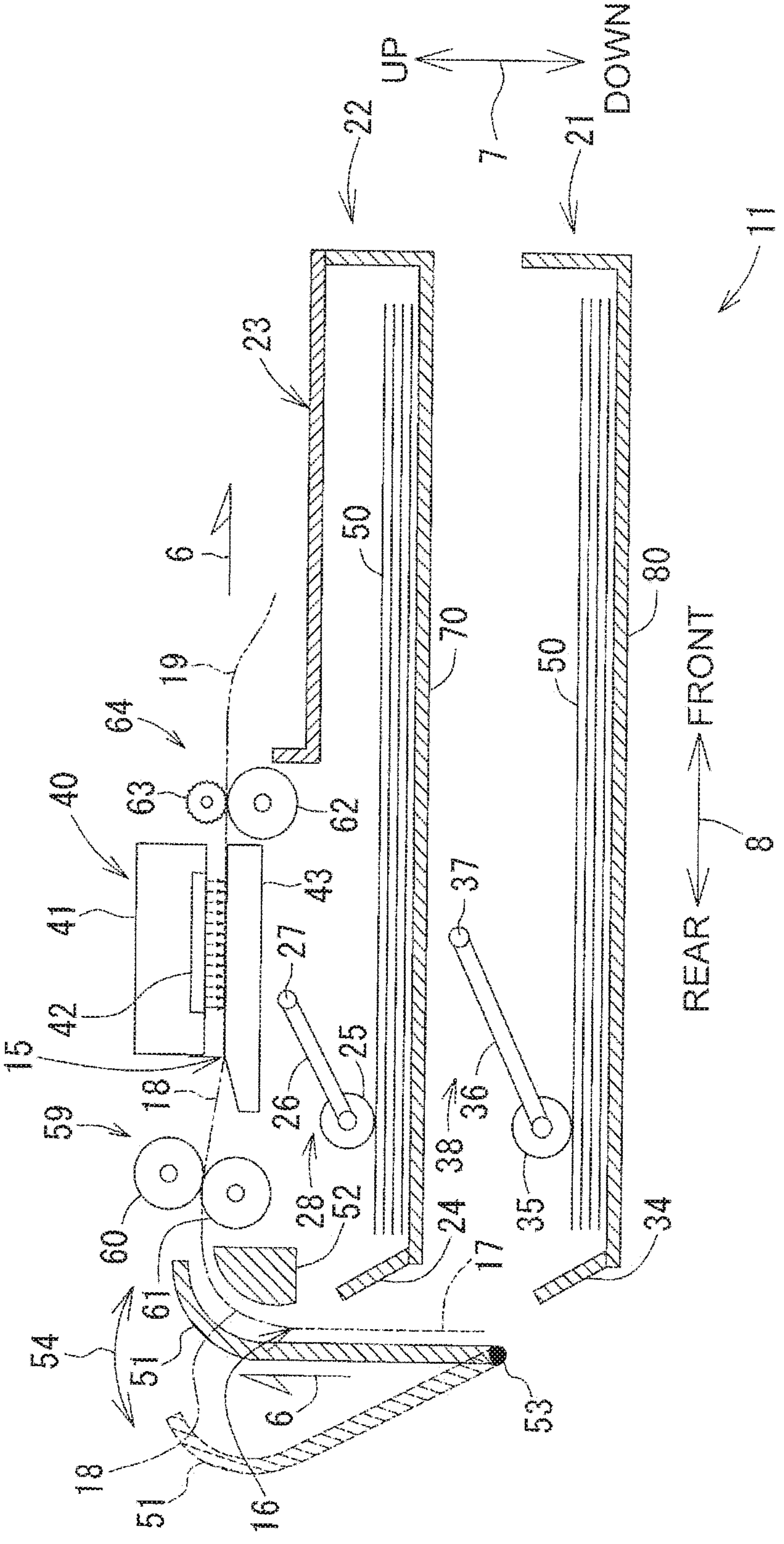
FIG. 3 is a vertical cross-sectional view showing schematically an inner structure of a printer of the multi-function device.

Recording sheets 50 are placed in the trays 21 and 22 (see FIG. 3). In the printer 11, the recording sheet 50 is selectively fed to the printer 11 from the second tray 21 or the first tray 22. The recording sheet 50 is output on an upper surface 23 of the first tray 22 after an image is recorded thereon by a recording unit 40 (see FIG. 3). The upper surface 23 functions as an output tray 23. The upper surface 23 of the first tray 22 is positioned on the front side (i.e., the right side in FIG. 3) of the multi-function device 10.

The multi-function device 10 is used while being connected to an external information equipment (not shown), such as a computer. The printer 11 records an image on the recording sheet 50 in accordance with print data received from the external information equipment or image data of an original document read by the scanner 12.

Figure 4:
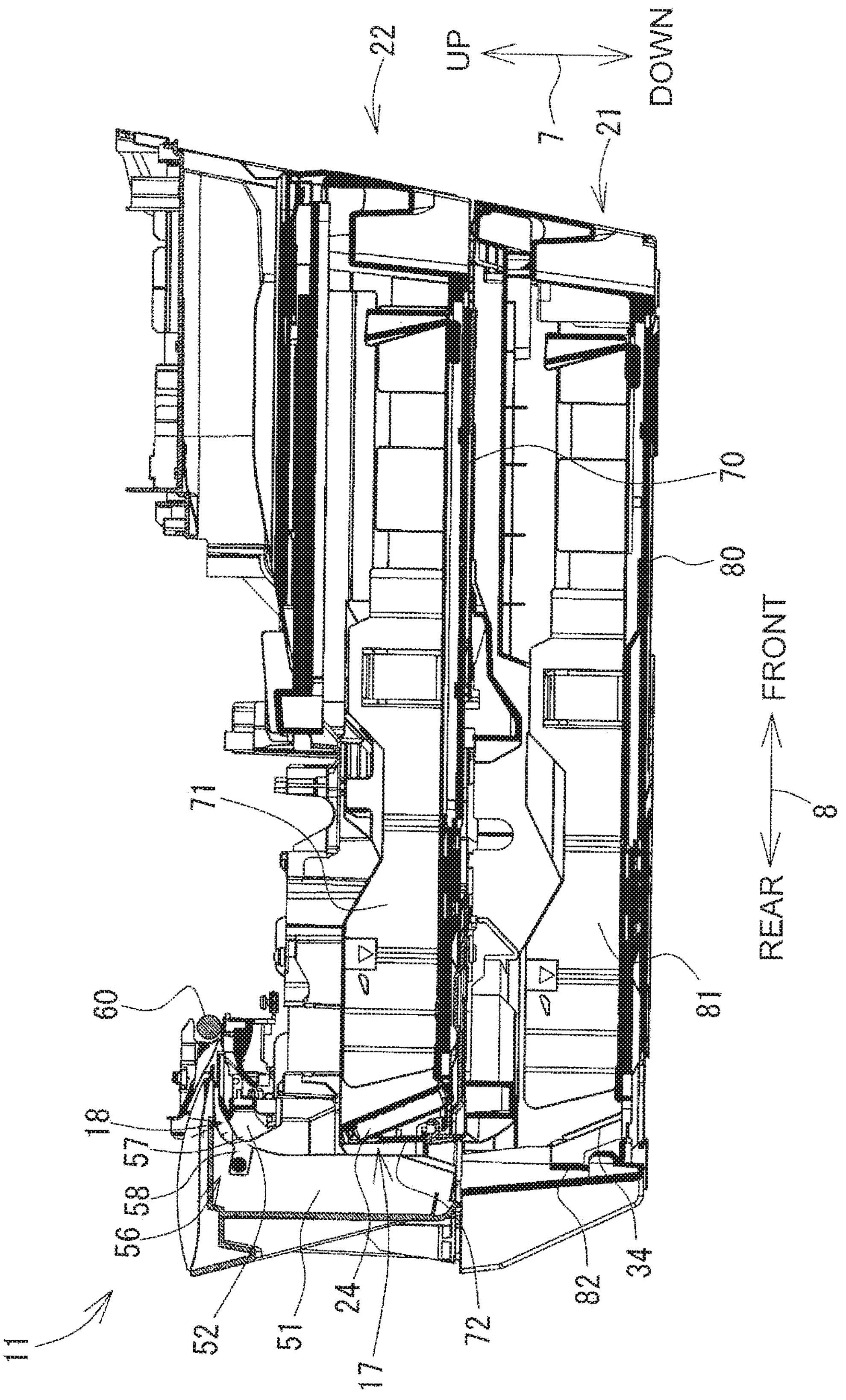
FIG. 4 is a vertical cross-sectional view showing an inner structure of the printer.

As shown in FIGS. 3 and 4, the second tray 21 and the first tray 22 are located below the recording unit 40. The second tray 21 and the first tray 22 are stacked vertically with the first tray 22 disposed above the second tray 21. The recording sheets 50 different in size or type can be held in the two trays 21 and 22.

The trays 21 and 22 are configured to be inserted in and removed from the printer 11. That is, the trays 21 and 22 are movable toward and away from the printer 11. As described above, the opening is formed on the front side of the printer 11. As shown in FIGS. 3 and 4, the trays 21 and 22 are inserted in the printer 11 from rear ends thereof (i.e., ends provided with inclined plates 24 and 34) through the opening. The trays 21 and 22 are located in the opening when fully inserted in the printer 11. In this state, the recording sheets 50 accommodated in the trays 21 and 22 are selectively fed to the printer 11. The trays 21 and 22 are removable from the printer 11 by being withdrawn from front ends thereof. This allows refilling of the trays 21 and 22 with the recording sheets 50.

The first tray 22 comprises a first bottom plate 70, a left side plate, a right side plate 71, and a standing plate, e.g., a first inclined plate 24. The recording sheet 50 is placed on the first bottom plate 70. The left side plate (not shown) and the right side plate 71 extend upright at both ends in the left-right direction of the first bottom plate 70. The first inclined plate 24 extends upward from a rear end portion of the first bottom plate 70, i.e., a downstream end portion of the recording sheet 50 in a feeding direction. The second tray 21 comprises a second bottom plate 80, a left side plate, a right side plate 81 and a second inclined plate 34. The recording sheet 50 is placed on the second bottom plate 80. The left side plate (not shown) and the right side plate 81 extend upright at both ends in the left-right direction of the second bottom plate 80. The second inclined plate 34 extends upward at a rear end portion of the second bottom plate 80. Thus, each of the trays 21 and 22 is shaped into substantially a box that opens upwardly.

The inclined plates 24 and 34 are inclined to facilitate smooth feeding of the recording sheet 50. In particular, each of the inclined plates 24 and 34 is inclined with respect to a corresponding one of the first and second bottom plates 70 and 80 such that the upper end of the inclined plate is located further rearward than the lower end (i.e., further downstream than the lower end in the feeding direction). An angle between the first inclined plate 24 and a surface of the first bottom plate 70 is determined such that the recording sheet 50 placed on the first bottom plate 70 is smoothly fed by a first feeder to a first path 18 while being guided by the first inclined plate 24. An angle between the second inclined plate 34 and a surface of the second bottom plate 80 is determined such that the recording sheet 50 placed on the second bottom plate 80 is smoothly fed by a second feeder 38 to a second path 17 while being guided by the second inclined plate 34.

As shown in FIGS. 3 and 4, the first path 18 is formed above the first inclined plate 24 of the first tray 22. As shown by a one-dot-one-dash line in FIG. 3, the recording sheet 50 is conveyed in a conveying direction 6, through the first path 18, from an upper side of the first inclined plate 24 to the recording unit 40. When the first tray 22 is inserted in the printer 11, the first inclined plate 24 is positioned below the first path 18 and the first feeder 28 is positioned above the first tray 22.

The first feeder 28 comprises a feed roller 25, an arm 26, and a shaft 27. The feed roller 25 feeds the recording sheet 50 placed in the first tray 22 one at a time to the first path 18. The feed roller 25 feeds the recording sheet 50 toward the recording unit 40. That is, the feed roller 25 feeds the recording sheet 50 in a feeding direction, i.e., from the front toward the rear. The feed roller 25 is rotatably provided at a distal end of the arm 26. In particular, as the feed roller 25 is rotated while being pressed against the recording sheet 50, the uppermost recording sheet 50 is fed toward the first inclined plate 24 with frictional force between a roller surface of the feed roller 25 and the recording sheet 50. The recording sheet 50 is guided upward with a leading edge in the feeding direction thereof being in contact with the first inclined plate 24, fed to the first path 18 and caused to pass through the first path 18. The first inclined plate 24 supports the recording sheet 50 fed from the first tray 22. The arm 26 is pivotably provided on the shaft 27 which is supported by a housing of the printer 11. The arm 26 is pivotably urged toward the first tray 22 due to the self weight or by elastic force of, for example, a spring.

The second path 17 is formed above the second inclined plate 34 of the second tray 21 and between the outer member the outer member 51 and the first inclined plate 24. As shown by a dashed line in FIG. 3, the recording sheet 50 is conveyed in the conveying direction 6, through the second path 17, from an upper side of the second inclined plate 34 to an upstream end 16 (see FIG. 3) of the first path 18. When the second tray 21 is inserted in the printer 11, the second inclined plate 34 is positioned below the second path 17 and the second feeder 38 is positioned above the second tray 21.

The second feeder 38 comprises a feed roller 35, an arm 36, and a shaft 37. The feed roller 35 feeds the recording sheet 50 placed in the second tray 21 one at a time to the second path 17. The feed roller 35 feeds the recording sheet 50 toward the recording unit 40. That is, the feed roller 25 feeds the recording sheet 50 in the feeding direction. The feed roller 35 is rotatably provided at a distal end of the arm 36. In particular, as the feed roller 35 is rotated while being pressed against the recording sheet 50, the uppermost recording sheet 50 is fed toward the second inclined plate 34 with frictional force between a roller surface of the feed roller 35 and the recording sheet 50. The recording sheet 50 is guided upward with a leading edge in the feeding direction thereof being in contact with the second inclined plate 34, fed to the second path 17 and caused to pass through the second path 17. The arm 36 is pivotably provided on the shaft 37 which is supported by the housing of the printer 11. The arm 36 is pivotably urged toward the second tray 21 due to the self weight or by elastic force of, for example, a spring.

As shown in FIG. 3, a discharging path 19 extends from a downstream end 15 in the conveying direction 6 of the first path 18 in the printer 11. As shown by a two-dot-one-dash line in FIG. 3, the recording sheet 50 having been conveyed along the first path 18 is conveyed along the discharging path 19. The discharging path 19 extends toward the front side of the multi-function device 10 from a position immediately below the recording unit 40 to a position above the upper surface 23 of the first tray 22.

As shown in FIG. 3, the recording unit 40 comprises a carriage 41 and a recording head 42 mounted on the carriage 41. The carriage 41 reciprocates in a main scanning direction (i.e., a direction perpendicular to a sheet plane of FIG. 3). The recording head 42 is supplied with ink of cyan (C), magenta (M), yellow (Y) or black (Bk) from ink cartridges (not shown). The recording head 42 discharges small droplets of ink through nozzles provided in a lower surface thereof. As the carriage 41 reciprocates in the main scanning direction, the recording heads 42 records an image on the recording sheet 50 which is conveyed on a platen 43. The platen 43 opposes the recording unit 40 and supports the recording sheet 50 conveyed on the discharging path 19.

As shown in FIGS. 3 and 4, a convey roller pair 59 is located on the upstream side of the recording unit 40 in the conveying direction 6 of the recording sheet 50. The convey roller pair 59 comprises a convey roller 60 and a pinch roller 61. The convey roller 60 is disposed above the first path 18 extending in the front-rear direction 8 and is driven to rotate by a conveying motor (not shown). The pinch roller 61 is rotatably disposed below the convey roller 60 via the first path 18 and is urged against the convey roller 60 by a spring.

A discharge roller pair 64 is located on the downstream side of the recording unit 40 in the conveying direction 6 of the recording sheet 50. The discharge roller pair 64 comprises a sheet discharge roller 62 and a spur 63. The sheet discharge roller 62 is disposed below the discharging path 19 and is driven to rotate by the conveying motor. The spur 63 is rotatably disposed above the sheet discharge roller 62 via the discharging path 19 and is urged against the sheet discharge roller 62 by a spring.

Figure 5:
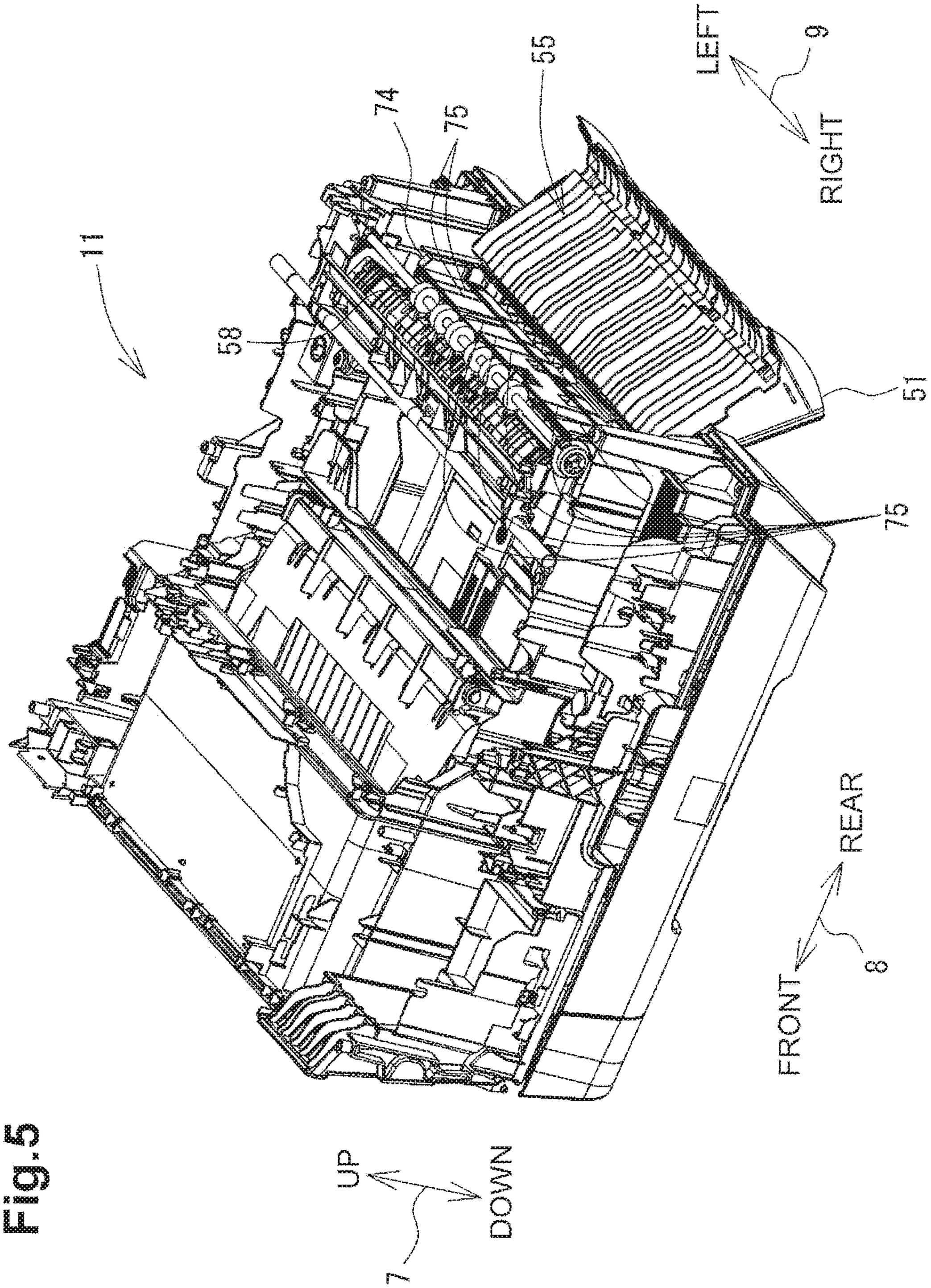
FIG. 5 is a perspective view showing an inner structure of the printer.

As shown in FIGS. 4 and 5, an intermediate roller pair 56 is located on the upstream side of the convey roller pair 59 in the conveying direction 6 of the recording sheet 50. The intermediate roller pair 56 is not shown in FIG. 3. The intermediate roller pair 56 comprises an intermediate roller 58 and a driven roller 57. The intermediate roller 58 is disposed on the rear side of the first path 18 extending in the vertical direction 7 and is driven to rotate by a motor (not shown). The driven roller 57 is rotatably disposed on the front side of the intermediate roller 58 via the first path 18 and is urged against the intermediate roller 58 by a spring.

The convey roller pair 59, the discharge roller pair 64, and the intermediate roller pair 56 nip the recording sheet 50 and convey the same along the paths 18 and 19.

The recording sheet 50 is fed, in the feeding direction, by the first feeder 28 from the first tray 22 or fed by the second feeder 38 from the second tray 21. The recording sheet 50 is then conveyed, in the conveying direction 6, by the intermediate roller 58 and the driven roller 57, and the convey roller pair 59 so as to make a U-turn and reach the recording unit 40. The recording sheet 50 is then discharged to the upper surface 23 of the first tray 22 by the discharge roller pair 64. The recording sheet 50 is conveyed from the first tray 22 or the second tray 21, via the recording unit 40, to the first tray 22 in a feed direction, e.g., the feeding direction as described above and the conveying direction 6, that is curved in a substantially U-shape.

As shown in FIGS. 3 and 4, the first path 18 is defined by an outer member 51 and an inner member 52 which oppose each other at a predetermined distance.

The inner member 52 is fixed, for example, to a frame of the printer 11 at a position above the first inclined plate 24 of the first tray 22. The inner member 52 extends, along the first path 18, from a position near and above the first inclined plate 24 to a position behind the convey roller pair 59. A surface of the inner member 52 bordering the first path 18 is formed as a substantially circular arc whose center is located on an inner side of the printer 11. The inner member 52 extends in the left-right direction 9 (i.e., in a direction perpendicular to a sheet plane of FIG. 4).

The outer member 51 extends from a position near and above the second inclined plate 34 to a position behind the convey roller pair 59, via a position near and above the first inclined plate 24. A surface of the outer member 51 opposing the inner member 52 is formed as a substantially circular arc whose center is located on an inner side of the printer 11. An upstream portion of the outer member 51 in the conveying direction 6 from the circular arc extends substantially vertically. The outer member 51 extends in the left-right direction 9 (i.e., in a direction perpendicular to a sheet plane of FIG. 4). Thus, the recording sheet 50 is fed through the first path 18 to the convey roller pair 59.

The upstream portion of the outer member 51, which extends between a position near and above the second inclined plate 34 and a position near and above the first inclined plate 24, opposes the first inclined plate 24 of the first tray 22. A downstream portion of the outer member 51, which has the circular arc shape, opposes the inner member 52. In other words, the outer member 51 extends from a lower position opposing the first inclined plate 24 to an upper position opposing the inner member 52. Thus, the second path 17 is defined by the outer member 51 and the first inclined plate 24 which oppose each other at a predetermined distance. The recording sheet 50 fed from the second tray 21 is conveyed through the second path 17 which is formed between the outer member 51 and the first inclined plate 24. Since the second path 17 is defined by the first inclined plate 24 and the outer member 51, and the first path 18 is defined by the inner member 52 disposed above the first inclined plate 24 and the outer member 51, the first path 18 and the second path 17 merge with each other. That is, the recording sheet 50 conveyed through the second path 17 to a position above the first incline plate 24 is then conveyed through the first path 18.

The first feeder 28 feeds the recording sheet 50 from the first tray 22 while contacting a first surface of the recording sheet 50. The inner member 52 is configured to guide the first surface of the recording sheet 50 fed by the first feeder 28. The downstream portion of the outer member 51 is configured to guide a second surface of the recording sheet 50 fed by the first feeder 38. The second surface of the recording sheet 50 is opposite to the first surface.

The second feeder 38 feeds the recording sheet 50 from the second tray 21 while contacting a first surface of the recording sheet 50. The inner member 52 is configured to guide the first surface of the recording sheet 50 fed by the second feeder 38. The first inclined plate 24 is configured to guide the first surface of the recording sheet 50 fed by the second feeder 38. The upstream portion of the outer member 51 is configured to guide a second surface of the recording sheet 50 fed by the second feeder 38. The second surface of the recording sheet 50 is opposite to the first surface. The downstream portion of the outer member 51 is configured to guide the second surface of the recording sheet 50 fed, between the inclined plate 24 and the upstream portion of the outer member 51, by the second feeder 38.

Figure 2:
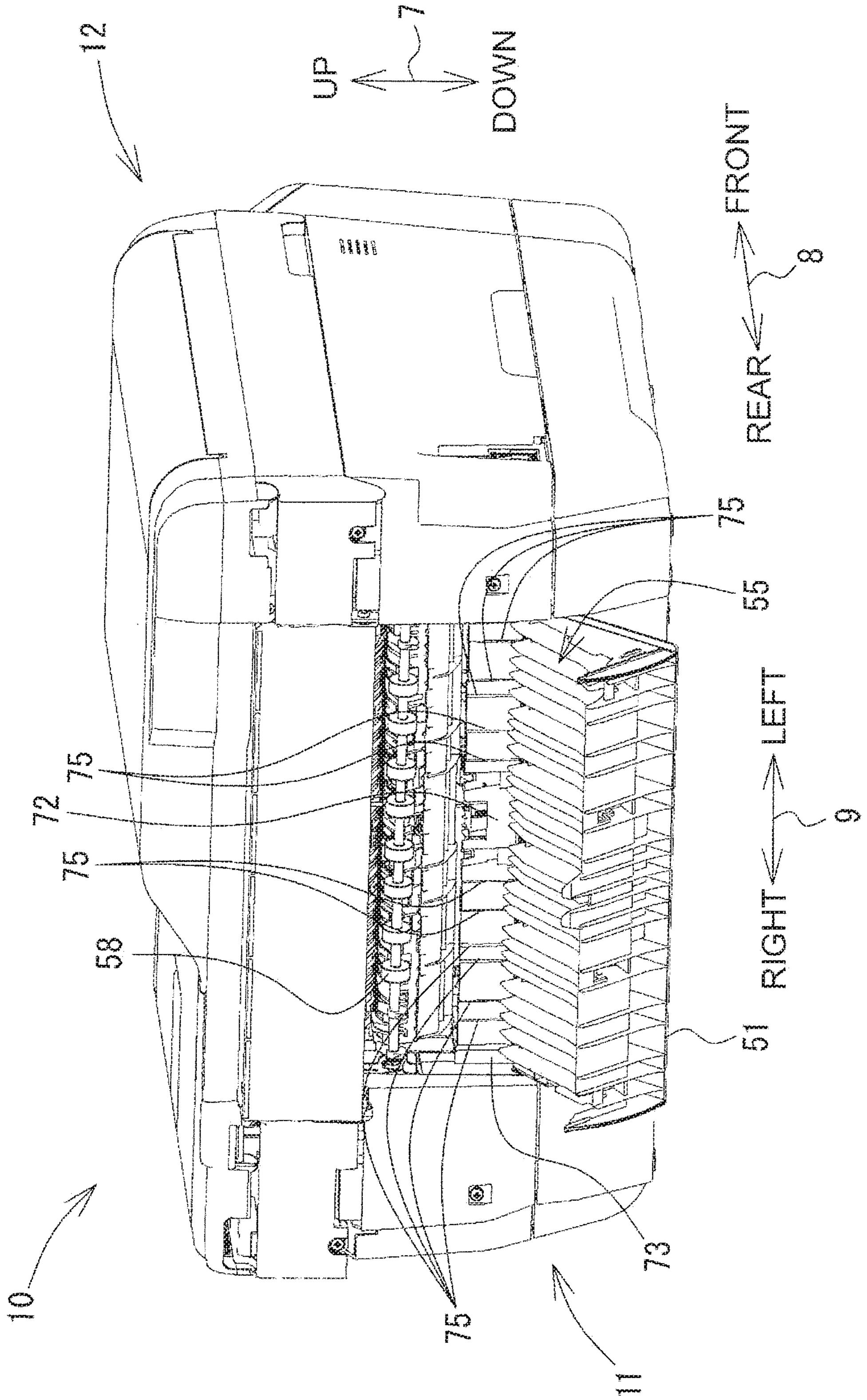
FIG. 2 is a perspective view of the multi-function device with an outer member in an open position.

The outer member 51 is pivotable in a direction of an arrow 54 about a shaft 53 which extends in the left-right direction 9 (i.e., in a direction perpendicular to a sheet plane of FIG. 3). The outer member 51 is configured to pivot between an open position (i.e., a first position shown by a dashed line in FIG. 3) and a closed position (i.e., a second position shown by a solid line in FIG. 3). When the outer member 51 is in the closed position, the paths 17 and 18 are covered with the outer member 51 from the rear and are thus shielded from the outside of the multi-function device 10. When the outer member 51 is in the open position, the paths 17 and 18 are exposed to the rear of the multi-function device 10. FIG. 1 shows the multi-function device 10 with the outer member 51 in the closed position, and FIG. 2 shows the multi-function device 10 with the outer member 51 in the open position.

Although not shown, the second tray 21 comprises side guides for guiding the left and right edges of the recording sheet 50, and the recording sheet 50 is fed toward the recording unit 40 while being center-aligned in the left-right direction 9. As shown in FIGS. 2 and 5, the first inclined plate 24 comprises projecting portions, e.g., projecting plates 73 and 74, provided at the ends in the left-right direction 9, on a rear surface which opposes the outer member 51 when the first tray 22 is inserted in the printer 11. The projecting plates 73 and 74 project toward the outer member 51 from the rear surface and extend along the second path 17. As shown in FIG. 2, the projecting plate 73 projects from the right end of the rear surface. As shown in FIG. 5, the projecting plate 74 projects from the left end of that surface. A distance between the projecting plate 73 and the projecting plate 74 may be slightly greater than a dimension in a width direction of the largest recording sheet 50 to be accommodated in the trays 21 and 22. The width direction is perpendicular to the conveying direction 6. That is, the projecting plate 73 and the projecting plate 74 are provided outside a region where the recording sheet 50 is conveyed along the second path 17. Thus, when the first tray 22 is inserted, the projecting plates 73 and 74 function as guide members which prevent skewing of the recording sheet 50 passing through the second path 17. The projecting plates 73 and 74 project from the outer surface to a height such that a predetermined distance is provided between the projecting plates 73 and 74 and the outer member 51.

When the first tray 22 is drawn out of the printer 11 and removed from the opening, the projecting plates 73 and 74 project from the rear surface of the first inclined plate 24. Thus, in the event that a user accidentally drops the first tray 22, the projecting plates 73 and 74 may collide with other objects, thereby reducing the possibility of damaging a surface of the first inclined plate 24 which defines the second path 17. The projecting plates 73 and 74 function as members to prevent damages to the first inclined plate 24.

Although the present embodiment is described with reference to the structure in which the projecting plates 73 and 74 function as the guide members and as the damage preventing members, the present invention is not limited thereto. The first inclined plate 24 may be provided in the printer 11 but not in the first tray 22. In this case, the projecting plates 73 and 74 of the first inclined plate 24 simply functions as guide members which guide the recording sheet 50 along the first path 18.

As shown in FIGS. 2 and 5, a plurality of ribs 75 are provided between the projecting plates 73 and 74 on a surface of the first inclined plate 24 which opposes the outer member 51 when the first tray 22 is inserted in the printer 11. The ribs 75 are arranged at predetermined intervals in the left-right direction 9 and project toward the outer member 51, and extend along the conveying direction 6. The ribs 75 project from the first inclined plate 24 to a height lower than that of the projecting plates 73 and 74. Some of the ribs 75 formed near a central portion of the first inclined plate 24 in the left-right direction 9 are located within the width of the recording sheet 50 fed from the second tray 21 and having the smallest size.

A plurality of ribs 55 are provided on an inner surface of the outer member 51. The ribs 55 are arranged at predetermined intervals in the left-right direction 9, and project toward the first inclined plate 24 and the inner member 52, and extend along the conveying direction 6. The ribs 55 project to a height that allows the recording sheet 50 to pass between the outer member 51 and the first inclined plate 24 and between the outer member 51 and the inner member 52.

The heights of the ribs 75 increase from the upstream side toward the downstream side in the conveying direction 6, i.e., from the lower side toward the upper side in the vertical direction 7. In addition, the heights of the ribs 55 from the outer member 51 increase from the upstream side toward the downstream side, i.e., from the lower side toward the upper side in the vertical direction 7. Accordingly, the distance between the ribs 55 on the outer member 51 and the ribs 75 on the first inclined plate 24 decreases from the upstream side toward the downstream side in the conveying direction 6. The ribs 55 and the ribs 75 are arranged at different positions in the left-right direction 9.

The printer 11, which comprises the first tray 22 and the second tray 21, requires two paths (i.e., the first path 18 and the second path 17). An outer side of the second path 17 is defined by the outer member 51, and an inner side of the second path 17 is defined by the first inclined plate 24. That is, according to the embodiment described above, since the inner side of the second path 17 is defined by the first inclined plate 24, it is not necessary to provide an additional member by which the inner side of the second path 17 is defined. Accordingly, an increase in size of the multi-function device 10 can be avoided even when the printer 11 has a plurality of vertically stacked trays 21 and 22.

The ribs 75 provided in the first inclined plate 24 reduce the contact area between the recording sheet 50 and the first inclined plate 24. Thus, the recording sheet 50 can be conveyed smoothly along the second path 17. In addition, the ribs 55 provided in the outer member 51 assist smooth conveyance of the recording sheet 50 along the second path 17.

The leading edge of the recording sheet 50 is likely to flap as it moves away from the feeders 28 and 38. Thus, the recording sheet 50 fed from the second tray 21 is like to flap in the downstream side of the second path 17 in the conveying direction 6. On the contrary, the recording sheet 50 is conveyed more stably in the upstream side than in the downstream side of the second path 17. According to the embodiment described above, the distance between the outer member 51 and the ribs 75 decreases toward the downstream side of the second path 17 in the conveying direction 6. That is, the second path 17 is narrowed in the downstream side. This structure prevents flapping of the recording sheet 50 in the downstream side and allows a stable conveyance of the recording sheet 5.

The projecting plates 73 and 74, which guide, in the width direction, the recording sheet 50 fed from the second tray 21, are formed on a rear surface of the first inclined plate 24, i.e., a surface of the first inclined plate 24 defining the second path 17. Thus, the recording sheet 50 is conveyed even more stably.

Since the outer member 51 is configured to move between different positions, the recording sheet 50, if jammed in the first path 18 or the second path 17, can be removed easily.

The first tray 22 is configured to be inserted in and removed from the printer 11. Thus, even if a paper jam of the recording sheet 50 occurs in the paths 17 and 18, the recording sheet 50 can be removed even more easily by changing the position of the outer member 51 to expose the paths 17 and 18 and by removing the first tray 22.

The projecting plates 73 and 74 are provided to project from the first inclined plate 24 toward the outer member 51. With this structure, in the event that, for example, the first tray 22 is accidentally dropped to the ground, the projecting plates 73 and 74 collide with the ground and the first inclined plate 24 is unlikely to contact with the ground. Thus, the first inclined plate 24 is unlikely to be damaged. Accordingly, when the first tray 22 is inserted in the printer 11, the recording sheet 50 is guided smoothly by the flawless first inclined plate 24.

The arrangement and shape of the ribs 55 and the ribs 75 are not limited to those of the embodiment described above. In particular, one of the ribs 55 and the ribs 75 may be constant in height in both the upstream and downstream sides in the conveying direction 6, and the other may increase in height toward the downstream side. The ribs 55 and the ribs 75 may be formed in the same positions in the left-right direction 9. Alternatively, the ribs 55 and the ribs 75 may be omitted.

Figure 6:
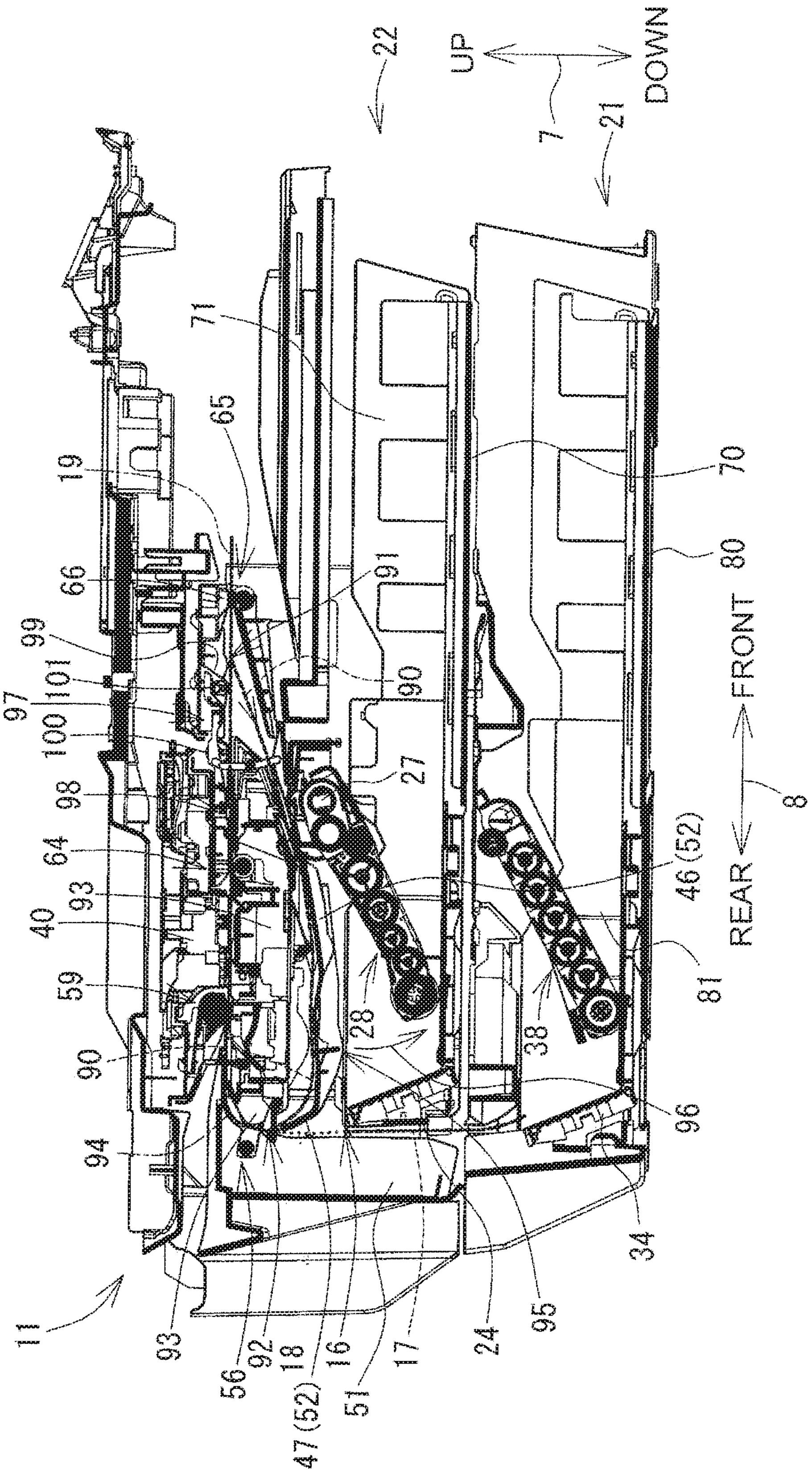
FIG. 6 is a vertical cross-sectional view showing an inner structure of a printer 4 capable of double-sided image recording.

The present invention may be implemented in a multi-function device 10 configured to perform double-sided image recording. According to another embodiment of the invention, a printer 11 of the multi-function device 10 capable of double-sided image recording may comprise a return path 90, as shown in FIG. 6. The return path 90 is formed from a discharging path 19 on a downstream side of a recording unit 40 in a conveying direction. A recording sheet 50 is guided along the return path 90 from the downstream side of the recording unit 40 to the upstream side in the conveying direction of an intermediate roller pair 56 disposed along the first path 18. The return path 90 is branched off the discharging path 19 at a branch section 91, positioned below the recording unit 40 and above the first tray 22, and joined to the first path 18 at a joint section 92. The recording sheet 50 is conveyed in a return direction along the return path 90. The return direction herein is shown by a dashed line with arrows in FIG. 6. The recording sheet 50 having an image formed on one surface (second surface) by a recording unit 40 is conveyed in reverse along the return path 90, turned over and fed to the recording unit 40 again. An image is recorded on the other surface (first surface) of the recording sheet 50 by the recording unit 40 in the same manner as on the one surface (second surface). The other surface (first surface) of the recording sheet 50 is the surface on which the first feeder 28 or the second feeder 38 contacts when feeding the recording sheet 50 from the first tray 22 or the second tray 21.

The printer 11 comprises a path switching unit 97 and a return roller pair 65 which guide the recording sheet 50 from the discharging path 19 to the return path 90. The path switching unit 97 is disposed on the downstream side of the discharge roller pair 64 in the conveying direction. The return roller pair 65 is disposed on the downstream side of the path switching unit 97 in the conveying direction. A driving roller 66, which is one of the return roller pair 65, is configured to rotate in the forward and reverse directions so as to convey the recording sheet 50 in the conveying direction and a direction opposite thereto.

The path switching unit 97 is pivotable about a shaft 98 between a discharge position (i.e., a position shown in FIG. 6) and a return position (i.e., a position in which a distal end 99 is pivoted down). When the path switching unit 97 is in the discharge position, the recording sheet 50 is discharged to an output tray 23 along the discharging path 19. When the path switching unit 97 is in the return position, the recording sheet 50 is guided to the return path 90. The path switching unit 97 comprises, at a lower surface thereof, spur-shaped auxiliary rollers 100 and 101.

In a normal state, the path switching unit 97 pivots downward due to the self weight and is kept in the return position. In this state, when a leading edge of the recording sheet 50 which has passed below the recording unit 40 reaches the path switching unit 97, the path switching unit 97 is pressed upward by an upper surface of the recording sheet 50 and changes from the return position to the discharge position. In this state, the recording sheet 50 further conveyed is pinched by the return roller pair 65 disposed on the downstream side in the conveying direction. As the driving roller 66 rotates in the forward direction while the path switching unit 41 is kept at the discharge position, the recording sheet 50 is conveyed toward the output tray 23. When a trailing edge of the recording sheet 50 reaches a predetermined position upstream of the auxiliary roller 101, force of the path switching unit 97 to pivot to the return position due to the self weight becomes greater than force of the recording sheet 50 to press the path switching unit 97 upward. Thus, the path switching unit 97 pivots from the discharge position to the return position. In this manner, the trailing edge of the recording sheet 50 is pressed downward by the auxiliary roller 101 and thus directed toward the return path 90.

For single-sided recording, the driving roller 66 continuously rotates in the forward direction and then the recording sheet 50 is discharged to the output tray 23. For double-sided recording, the rotational direction of the driving roller 66 is switched from the forward direction to the reverse direction in the state in which the trailing edge of the recording sheet 50 is directed toward the return path 90. In this manner, the recording sheet 50 is switched back to the return path 90.

An inner member 52 and an upper member 93 define the return path 90. The inner member 52 is a plate member positioned above the first tray 22 and extending in a left-right direction 9 and a front-rear direction 8. The inner member 52 is curved upward at a rear end thereof. That is, the inner member 52 comprises a main body 46 and an end portion 47. The main body 46 extends in the left-right direction 9 and the front-rear direction 8 at a position above the first tray 22. The end portion 47 extends in the left-right direction 9 and the vertical direction 7 at a rear end of the inner member 52. The main body 46 opposes the upper member 93. The main body 46 and the upper member 93 define the return path 90. The end portion 47 opposes the outer member 51. The end portion 47 and the outer member 51 define the first path 18.

The upper member 93 is disposed between the recording unit 40 and the inner member 52. That is, the opposite member 93 opposes the inner member 52 from above, and the inner member 52 and the opposite member 93 define the return path 90. The upper member 93 opposes the recording unit 40 from below, and the upper member 93 and the recording unit 40 define the discharging path 19. The outer member 51 opposes a downstream end of the upper member 93 in the return direction. In other word, the outer member 51 opposes an upstream portion of the upper member 93, and the upstream portion is positioned upstream from the recording unit 40 in the conveying direction 40. The upper member 93 and the outer member 51 define a third path 94. The outer member 51 is configured to guide the first surface of the recording sheet 50 while the upper member 93 is configured to guide the second surface of the recording sheet 50.

As described above, unlike the foregoing embodiment depicted in FIG. 3, the first path 18 extends from an upstream end 16 (i.e., an upper end of the first inclined plate 24) to the joint section 92. The third path 94 extends from the joint section 92 to the recording unit 40.

Figure 8:
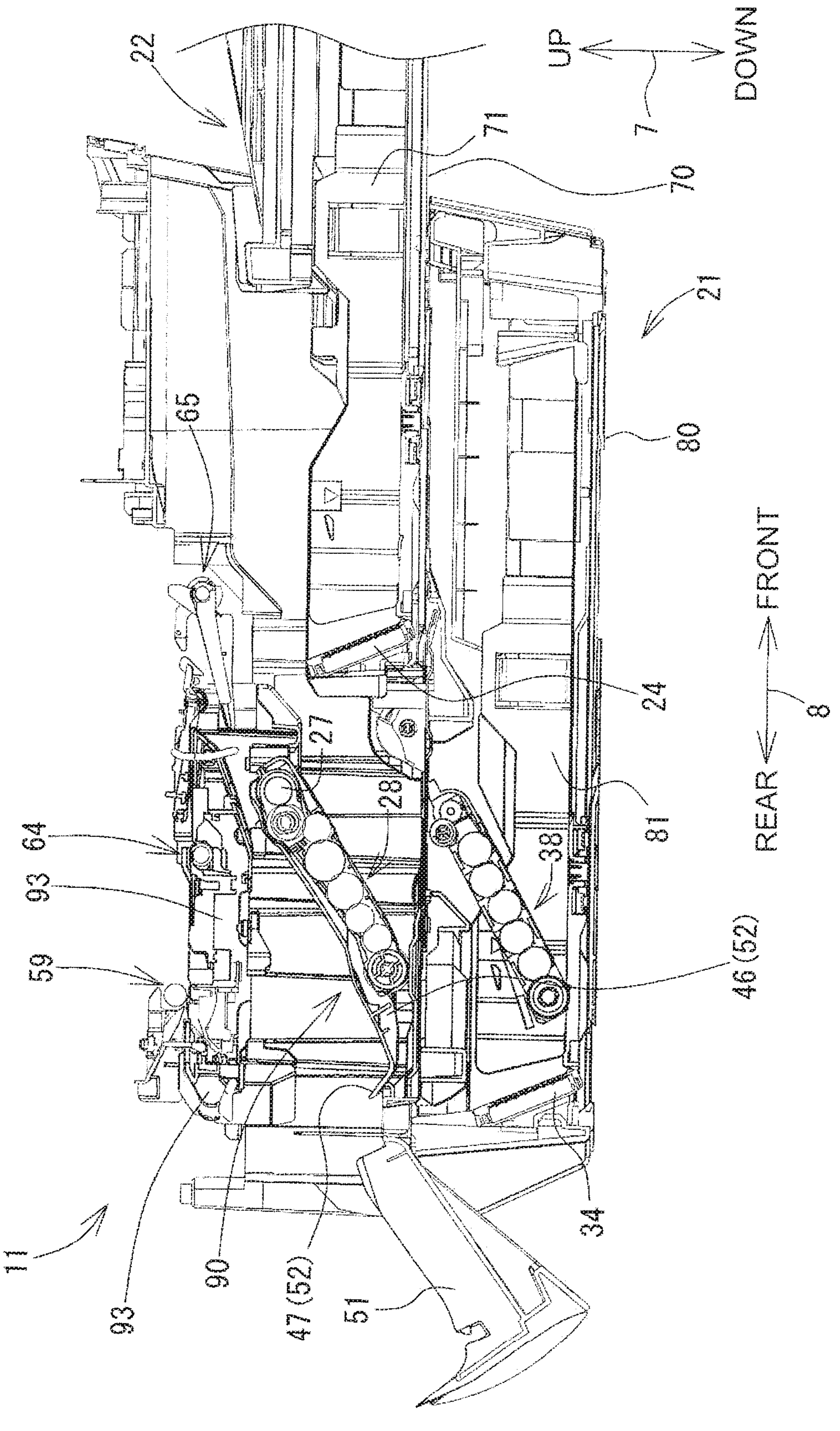
FIG. 8 is a vertical cross-sectional view showing an inner structure of a printer capable of double-sided image recording and a state where a return path is released and exposed rearward.

As shown in FIGS. 6 and 8, a base end (i.e., a front end) of the main body 46 is supported by a shaft 27 of a first feeder 28 such that the inner member 52 is pivotable about the shaft 27. That is, the downstream side of the inner member 52 in the return direction moves vertically. When the first tray 22 is inserted into a predetermined position of the printer 11 (i.e., a state shown in FIG. 6), a contact portion, e.g., a lower surface 95, of the front end of the main body 46 of the inner member 52 contacts the first tray 22 (i.e., an upper surface of a right side plate 71 of the first tray 22), and the inner member 52 is supported by the first tray 22.

The inner member 52 pivots into an upper position when the lower surface 95 contacts the first tray 22 (see FIG. 6). In the upper position, the inner member 52 defines the return path 90, together with the upper member 93. The inner member 52 located in the upper position guides the recording sheet 50. When the first tray 22 is withdrawn from the printer 11 (i.e., when the first tray 22 is retracted from the predetermined position in a direction away from the outer member 51), the inner member 52 loses the support of the first tray 22 and pivots toward the direction of an arrow 96, i.e., downward. The inner member 52 located in a lower position releases and opens the return path 90, as shown in FIG. 8. As shown in FIG. 8, when the outer member 51 is moved to an open position while the inner member 52 is in the lower position, the return path 90 is exposed rearward from the multi-function device 10.

In this embodiment, the inner member 52 defines the return path 90 while defining the first path 90. This configuration reduces the size of the multi-function device 10 as compared with a case in which the return path 90 is defined by an additional member provided separately from the inner member 52.

In the event that the recording sheet 50 is jammed, for example, by being caught in the return path 90, the return path 90 can be exposed by retracting the first tray and by moving the outer member 51 into the open position, thereby facilitating handling of the recording sheet 50. That is, even if the recording sheet 50 is jammed in the return path 90, the recording sheet 50 can be readily removed.

Figure 7:
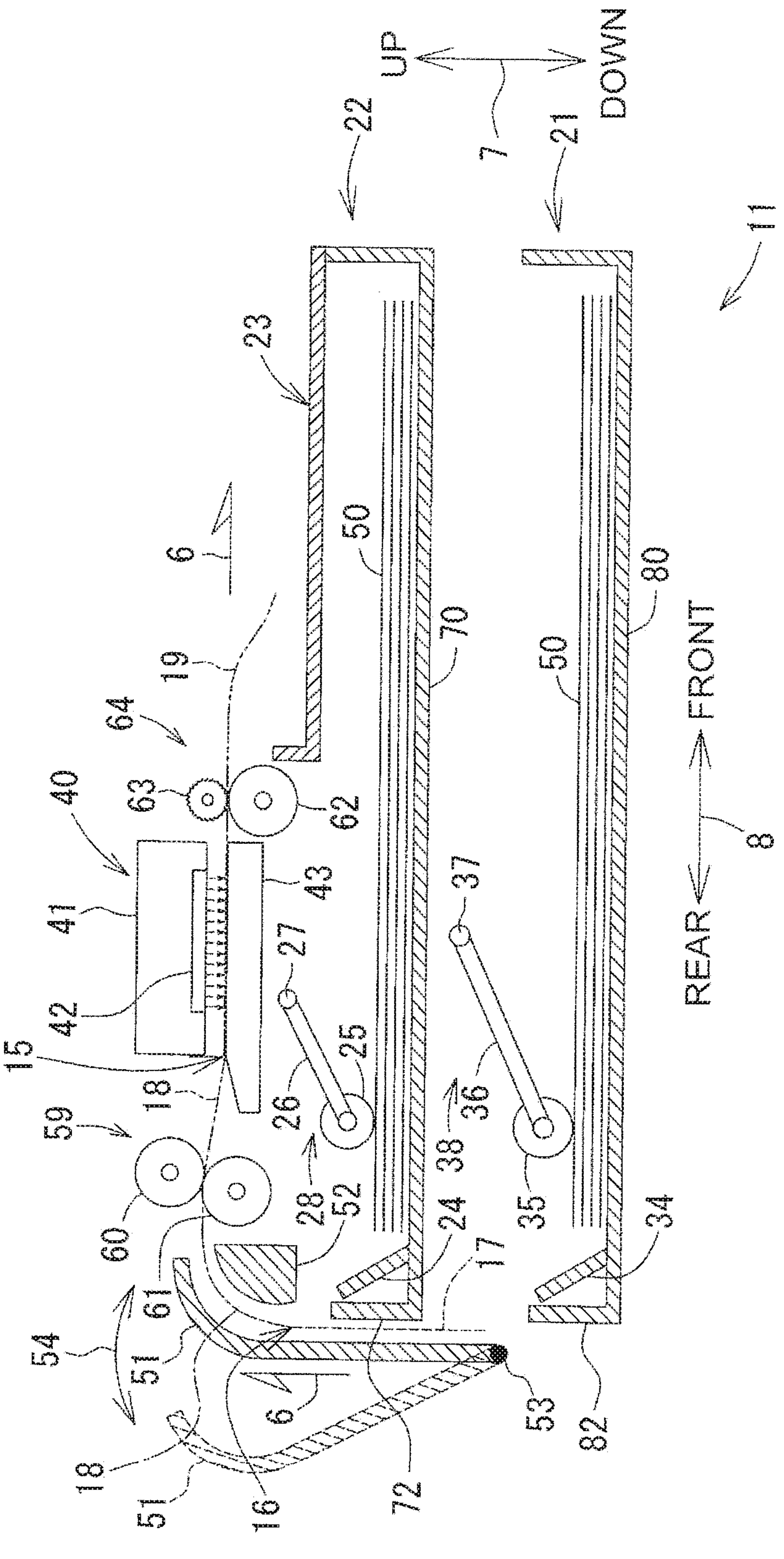
FIG. 7 is a vertical cross-sectional view showing an inner structure of a printer comprising trays each having a rear plate.

In the embodiment depicted in FIG. 3, the first inclined plate 24 functions as a standing plate which defines the second path 17 in cooperation with the outer member 51 and guides the recording sheet 50 fed from the second tray 21. However, the first inclined plate 24 does not necessarily function as the standing plate. In another embodiment of the invention, as shown in FIG. 7, the first tray 22 may be provided with a rear plate 72 in addition to the first bottom plate 70, the left side plate, the right side plate 71 and the first inclined plate 24. The rear plate 72 extends upright from a position behind the first inclined plate 24. In this case, the outer member 51 and the rear plate 72, as a standing plate, define the second path 17. The second tray 21 may be provided with a rear plate 82, similarly to the first tray 22.

In the embodiment depicted in FIG. 3, the outer member 51 is movable between the closed position and the open position. However, in another embodiment, the outer member 51 may be removably attached to the printer 11. That is, when the outer member 51 is removed from the printer 11, the paths 17 and 18 are exposed rearward from the multi-function device 10. In the event that the recording sheet 50 is jammed in the paths 17 and 18, the jammed recording sheet 50 can be readily removed.

In the embodiment depicted in FIG. 3, the trays 21 and 22 are slidable in the front-rear direction 8. However, the printer 11 may comprise the trays 21 and 22 which do not slide. For example, the trays 21 and 22 may be fixed to the printer 11. In another embodiment, the trays 21 and 22 may be withdrawn from the printer 11 halfway. That is, the trays 21 and 22 may be configured not to be removed completely from the printer 11.

In the embodiment depicted in FIG. 3, the inclined plates 24 and 34 are provided in the trays 22 and 21. However, in another embodiment, the inclined plates 24 and 34 may be provided in the printer 11 other than in the trays 22 and 21.

In the embodiment depicted in FIG. 3, the outer member 51 is formed by a single member. However, in another embodiment, the outer member 51 may be formed by two or more members. The outer member 51 may be formed by a first outer member (not shown) and a second outer member (not shown). The first outer member may oppose the inner member 52 and defines the first path 18 in cooperation with the inner member 52. The second outer member may oppose the first inclined plate 24 at a position below the first outer member and define the second path 17 in cooperation with the first inclined plate 24.

While the invention has been described in connection with embodiments of the invention, it will be understood by those skilled in the art that variations and modifications of the embodiments described above may be made without departing from the scope of the invention. Other embodiments will be apparent to those skilled in the art from a consideration of the specification or practice of the invention disclosed herein. It is intended that the specification and the described examples are considered merely as exemplary of the invention, with the true scope of the invention being defined by the following claims.

What is claimed is:

1. An image recording device comprising:

a housing;

a first tray detachably attached to the housing and comprising a first plate configured to support sheets thereon;

a second tray disposed below the first tray and comprising a second plate configured to support sheets thereon;

a recording unit configured to record an image on a sheet;

a first feeder configured to feed a sheet from the first tray toward the recording unit;

a second feeder configured to feed a sheet from the second tray toward the recording unit;

an inner member disposed above the first tray and configured to guide a sheet toward the recording unit;

a standing plate disposed downstream of one end of the first plate of the first tray in a sheet feed direction from the first tray;

a first portion movable relative to the standing plate and configured to, when at a first path-defining position, define a first path by facing the standing plate and guide, along the first path, a sheet fed from the second tray; and a second portion forming an arc and movable relative to the inner member and configured to, when at a second path-defining position, define a second path between the second portion and the inner member and guide, along the second path, a sheet fed selectively from the inner member, the first tray, and the second tray.

2. The image recording device according to claim 1, wherein the second portion and the first portion are integrally formed so as to move concurrently to the respective second and first path-defining positions.

3. The image recording device according to claim 1, wherein the second portion and the first portion are configured to pivot about a common pivot axis.

4. An image recording device comprising:

a housing;

a first tray detachably attached to the housing and comprising a first plate configured to support sheets thereon;

a second tray disposed below the first tray and comprising a second plate configured to support sheets thereon;

a recording unit configured to record an image on a sheet;

a first feeder configured to feed a sheet from the first tray toward the recording unit;

a second feeder configured to feed a sheet from the second tray toward the recording unit;

an inner member disposed above the first tray and configured to guide a sheet toward the recording unit;

a standing plate disposed downstream of one end of the first plate of the first tray in a sheet feed direction from the first tray;

a first portion movable relative to the standing plate and configured to, when at a first path-defining position, define a first path by facing the standing plate and guide, along the first path, a sheet fed from the second tray; and a second portion movable relative to the inner member and configured to, when at a second path-defining position, define a second path between the second portion and the inner member and guide, along the second path, a sheet fed selectively from the inner member, the first tray, and the second tray; and wherein the inner member is movable down in a state where the first tray is detached from the housing.

5. The image recording device according to claim 4, wherein the inner member is pivotable down in the state where the first tray is detached from the housing.

6. The image recording device according to claim 1, wherein the recording unit is disposed downstream of the second portion in the sheet feed direction along the second path.

7. The image recording device according to claim 1, wherein the inner member is configured to guide a sheet having an image recorded thereon back toward the recording unit.

8. The image recording device according to claim 1, wherein the standing plate is integrally attached to the first tray.

9. The image recording device according to claim 1, wherein the standing plate includes a plurality of ribs protruding toward the first portion.

10. The image recording device according to claim 1, wherein the inner member is movable down in a state where the first tray is detached from the housing.

11. The image recording device according to claim 10, wherein the inner member is pivotable down in the state where the first tray is detached from the housing.

12. The image recording device according to claim 4, wherein the second portion and the first portion are integrally formed so as to move concurrently to the respective second and first path-defining positions.

13. The image recording device according to claim 4, wherein the second portion and the first portion are configured to pivot about a common pivot axis.

14. The image recording device according to claim 4, wherein the recording unit is disposed downstream of the second portion in the sheet feed direction along the second path.

15. The image recording device according to claim 4, wherein the inner member is configured to guide a sheet having an image recorded thereon back toward the recording unit.

16. The image recording device according to claim 4, wherein the standing plate is integrally attached to the first tray.

17. The image recording device according to claim 4, wherein the standing plate includes a plurality of ribs protruding toward the first portion.

18. The image recording device according to claim 5, wherein the second portion and the first portion are integrally formed so as to move concurrently to the respective first and second path-defining positions.

19. The image recording device according to claim 11, wherein the second portion and the first portion are configured to pivot about a common pivot axis.

20. The image recording device according to claim 11, wherein the second portion and the first portion are integrally formed so as to move concurrently to the respective first and second path-defining positions.

* * * * *

UNITED STATES PATENT AND TRADEMARK OFFICE

CERTIFICATE OF CORRECTION

PATENT NO. : 11,148,439 B2
APPLICATION NO. : 16/809826
DATED : October 19, 2021
INVENTOR(S) : Tetsuo Asada, Kensuke Hirate and Yoshiyuki Washino It is certified that error appears in the above-identified patent and that said Letters Patent is hereby corrected as shown below:

In the Claims

Claim 18, Column 14, Line 56, please change "first and second" to --second and first--.

Claim 20, Column 14, Line 63, please change "first and second" to --second and first--.

Signed and Sealed this
Seventeenth Day of May, 2022

Katherine Kelly Vidal

Katherine Kelly Vidal
*Director of the United States Patent and Trademark Office*